(12) United States Patent
Sasaki et al.

(10) Patent No.: US 9,543,121 B2
(45) Date of Patent: Jan. 10, 2017

(54) INDUCTIVELY COUPLED PLASMA PROCESSING APPARATUS

(75) Inventors: Kazuo Sasaki, Nirasaki (JP); Toshihiro Tojo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 789 days.

(21) Appl. No.: 13/451,867

(22) Filed: Apr. 20, 2012

(65) Prior Publication Data

US 2012/0267051 A1  Oct. 25, 2012

(30) Foreign Application Priority Data

Apr. 21, 2011 (JP) .................... 2011-095154

(51) Int. Cl.
| | | |
|---|---|---|
| C23C 16/00 | (2006.01) | |
| H01L 21/306 | (2006.01) | |
| H01J 37/32 | (2006.01) | |

(52) U.S. Cl.
CPC ...... *H01J 37/3211* (2013.01); *H01J 37/32119* (2013.01)

(58) Field of Classification Search
CPC  H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | |
|---|---|---|
| 6,331,754 B1 | 12/2001 | Satoyoshi et al. |
| 6,350,347 B1 | 2/2002 | Ishii et al. |
| 2001/0002584 A1* | 6/2001 | Liu .................. C23C 14/48 |
| | | 118/723 I |
| 2004/0007182 A1 | 1/2004 | Hongoh et al. |
| 2008/0035058 A1 | 2/2008 | Tian et al. |
| 2010/0175831 A1* | 7/2010 | Sasaki .................. 156/345.48 |

FOREIGN PATENT DOCUMENTS

| | | |
|---|---|---|
| CN | 101002509 A | 7/2007 |
| JP | 3077009 | 6/2000 |
| JP | 2004-47730 A | 2/2004 |
| JP | 2004-134495 | 4/2004 |
| JP | 3609985 | 10/2004 |
| JP | 2008-130651 | 6/2008 |
| JP | 2011-29584 | 2/2011 |

* cited by examiner

*Primary Examiner* — Luz Alejandro Mulero
(74) *Attorney, Agent, or Firm* — Oblon, McClelland, Maier & Neustadt, L.L.P.

(57) ABSTRACT

An inductively coupled plasma processing apparatus performs plasma processing on a substrate by generating an inductively coupled plasma in a plasma generation region in a processing chamber. The apparatus includes a high frequency antenna for generating the inductively coupled plasma in the plasma generation region and a metal window provided between the plasma generation region and the high frequency antenna. The metal window is firstly divided into two or more sections electrically insulated from each other by a line along a peripheral direction of the metal window and then secondly divided into sections electrically insulated from each other by lines along directions crossing with the peripheral direction.

11 Claims, 15 Drawing Sheets

COMPARATIVE EXAMPLE

INDUCTIVELY COUPLED PLASMA PROCESSING APPARATUS

CROSS-REFERENCE TO RELATED APPLICATION

This application claims priority to Japanese Patent Application No. 2011-095154 filed on Apr. 21, 2011, the entire content of which is incorporated herein by reference.

FIELD OF THE INVENTION

The present invention relates to an inductively coupled plasma processing apparatus for performing plasma processing on a substrate, e.g., a glass substrate for use in a flat panel display (FPD) such as a liquid crystal display (LCD) or the like.

BACKGROUND OF THE INVENTION

In a process for manufacturing a LCD or the like, various plasma processing apparatuses such as a plasma etching apparatus, a plasma CVD film forming apparatus and the like are used to perform a predetermined process on a glass substrate. Conventionally, a capacitively coupled plasma processing apparatus has been widely used as the plasma processing apparatus. Recently, however, attention has been paid to an inductively coupled plasma (ICP) processing apparatus capable of generating a high-density plasma.

A high frequency antenna is provided at an outer side of a dielectric window of a processing chamber for accommodating a target substrate to be processed. In the processing chamber, an inductively coupled plasma is generated by supplying a processing gas to the processing chamber and applying a high frequency power to the high frequency antenna. By using the inductively coupled plasma thus generated, a predetermined plasma processing is performed on the target substrate. A planar antenna having a predetermined pattern is widely used for the high frequency antenna of the inductively coupled plasma processing apparatus (see, e.g., Japanese Patent Publication No. 3077009).

Recently, a target substrate to be processed has been increased in size. For example, a rectangular glass substrate for use in an LCD is considerably scaled up from about 1500 mm×1800 mm (short side×long side) to about 2200 mm×2400 mm and further to about 2800 mm×3000 mm.

In the inductively coupled plasma processing apparatus, a dielectric window is interposed between the high frequency antenna and a plasma generation region in the processing chamber. As the substrate to be processed is scaled up, the dielectric window is scaled up. As described in Japanese Patent Publication No. 3077009, the dielectric window is generally made of quartz glass or ceramic.

However, quartz glass or ceramic is soft and thus is not suitable for the scaling up of the dielectric window. Japanese Patent Publication No. 3609985 discloses a measure to divide quartz glass to deal with the scaled up dielectric window.

Since, however, the target substrate to be processed is scaled up considerably, it is difficult to deal with the scaled up dielectric window by the measure disclosed in Japanese Patent Publication No. 3609985.

Hence, Japanese Patent Application Publication No. 2011-29584 discloses a technique capable of dealing with the scaling up of the target substrate to be processed by substituting a dielectric window with a metal window having an increased strength.

The technique described in Japanese Patent Application Publication No. 2011-29584 can deal with the scaling up of the substrate to be processed. Since, however, a plasma generation mechanism in a metal window is different from that in a dielectric window, there occurs a separate problem related to the scaling up of the metal window. For example, an eddy current circulating in a loop through the metal window is diffused in a direction perpendicular to a current flow direction (hereinafter, simply referred to as "diffusion of eddy current"), and it is difficult to control plasma distribution in the processing chamber.

SUMMARY OF THE INVENTION

In view of the above, the present invention provides an inductively coupled plasma processing apparatus capable of dealing with a target substrate to be processed of a larger size and improving controllability of plasma distribution in a processing chamber.

In accordance with a first embodiment of the present invention, there is provided an inductively coupled plasma processing apparatus for performing plasma processing on a substrate by generating an inductively coupled plasma in a plasma generation region in a processing chamber, the apparatus including: a high frequency antenna for generating the inductively coupled plasma in the plasma generation region; and a metal window provided between the plasma generation region and the high frequency antenna, wherein the metal window is firstly divided into two or more sections electrically insulated from each other by a line along a peripheral direction of the metal window and then secondly divided into sections electrically insulated from each other by lines along directions crossing with the peripheral direction.

In accordance with a second embodiment of the present invention, there is provided an inductively coupled plasma processing apparatus for performing plasma processing on a substrate by generating an inductively coupled plasma in a plasma generation region in a processing chamber, the apparatus including: a high frequency antenna for generating the inductively coupled plasma in the plasma generation region; and a metal window provided between the plasma generation region and the high frequency antenna, wherein the metal window is divided by lines along directions crossing with the peripheral direction of the metal window, and each of the sections of the metal window which are divided by the lines along the directions crossing with the peripheral direction is firstly partitioned into two or more regions by slits formed in the metal window With such configuration, it is possible to provide an inductively coupled plasma processing apparatus capable of dealing with a target substrate to be processed of a larger size and improving controllability of plasma distribution in a processing chamber.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof.

First Embodiment

Figure 1:
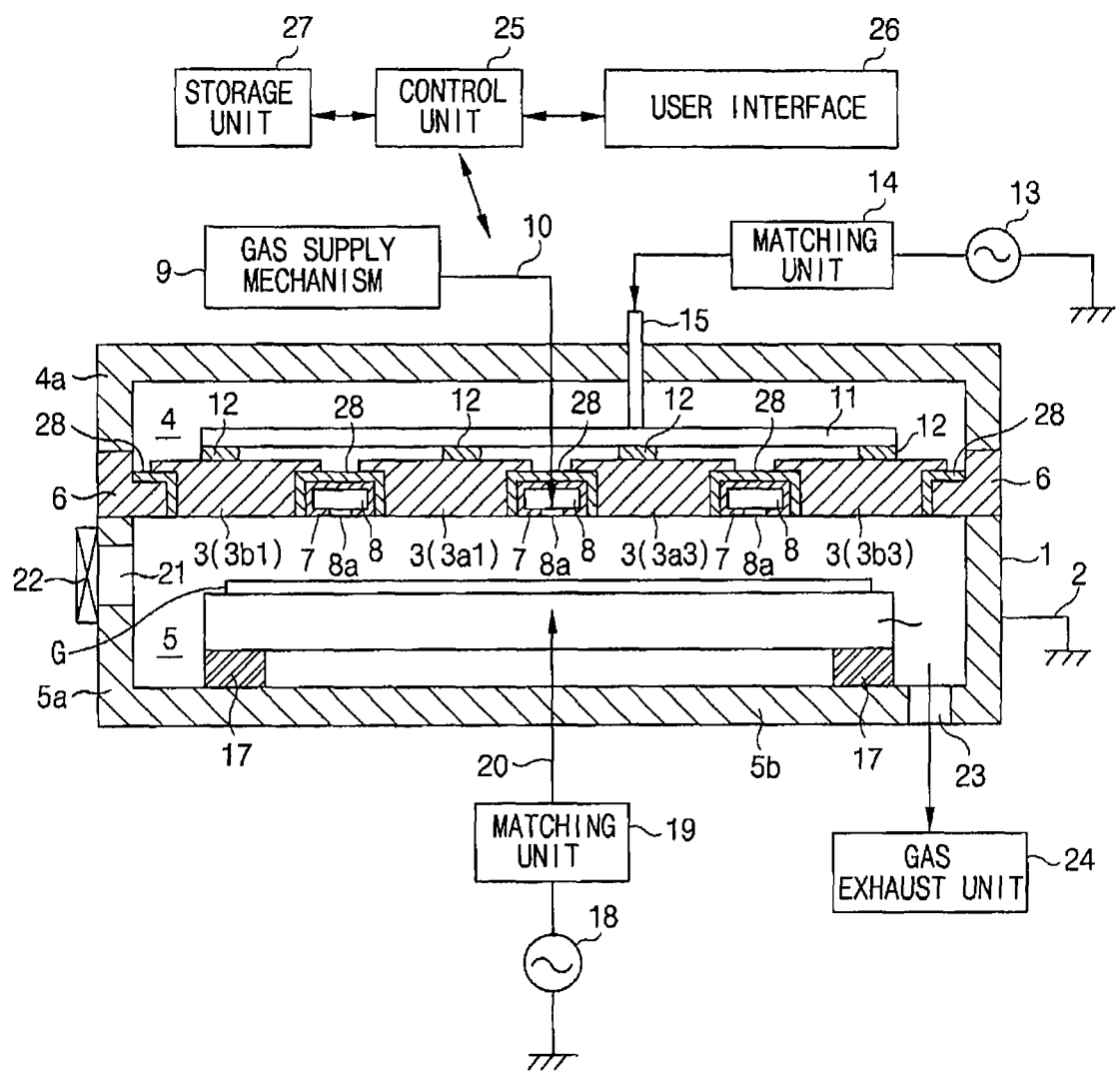
FIG. 1 is a cross sectional view schematically showing an inductively coupled plasma processing apparatus in accordance with a first embodiment of the present invention.

FIG. 1 is a cross sectional view schematically showing an inductively coupled plasma processing apparatus in accordance with a first embodiment of the present invention. The inductively coupled plasma processing apparatus shown in FIG. 1 can be used to perform plasma processing, e.g., etching of an oxide film, an ITO film and a metal film in forming a thin film transistor on a glass substrate for use a FPD, and ashing of a resist film or the like. Herein, the FPD includes a liquid crystal display (LCD), an electro luminescence (EL) display, a plasma display panel (PDP) and the like. The inductively coupled plasma processing apparatus can also be used to perform the plasma processing on a glass substrate for use in a solar cell panel as well as a glass substrate for use a FPD.

The plasma processing apparatus includes a airtight main vessel 1 made of a conductive material, e.g., aluminum whose inner surface is anodically oxidized (alumite treated). The main vessel 1 has an angular shape as seen from above and is grounded via a ground line 2. The inside of the main vessel 1 is vertically partitioned into an antenna chamber 4 and a processing chamber 5 by a metal window 3 insulated from the main vessel 1. In this example, the metal window 3 serves as a ceiling wall of the processing chamber 5. The metal window 3 is made of, e.g., a nonmagnetic conductive metal. An example of the nonmagnetic conductive metal is aluminum or an alloy containing aluminum.

Provided between a sidewall 4a of the antenna chamber and a sidewall 5a of the processing chamber 5 are a supporting bracket 6 projecting toward the inside of the main vessel 1 and a supporting beam 7. The supporting bracket 6 and the supporting beam 7 are made of a conductive material, preferably a metal. An example of the metal is aluminum. In the present embodiment, the supporting beam 7 also serves as a shower housing for supplying a processing gas. When the supporting beam 7 also serves as the shower housing, a gas channel 8 extended in a direction parallel to a target surface of a target substrate to be processed G is formed inside the supporting beam 7. The gas channel 8 is provided with a plurality of gas injection openings 8a through which a processing gas is injected into the processing chamber 5. The processing gas is supplied from a processing gas supply unit 9 to the gas channel 8 through a gas supply line 10, and then is injected into the processing chamber 5 through the gas injection openings 8a. When making the metal window 3 serve as a shower head, the processing gas may be supplied from the metal window 3 as well as the supporting beam 7.

In the antenna chamber 4, a high frequency antenna 11 is disposed above the metal window 3 so as to face the metal window 3. The high frequency antenna 11 is spaced apart from the metal window 3 by a spacer 12 formed of an insulating member. During the plasma processing, a high frequency power for generating an inductive electric field is applied from a first high frequency power supply 13 to the high frequency antenna 11 via a matching unit 14 and a power feed member 15. A frequency of the high frequency power is, e.g., about 13.56 MHz. By applying a high frequency power to the high frequency antenna 11, the inductive electric field is generated in a plasma generation region in the processing chamber 5 via a loop current induced in the metal window as will be described later. Due to the inductive electric field, a processing gas supplied from the gas injection openings 8a is converted into a plasma in the plasma generation region in the processing chamber 5.

A mounting table 16 opposite to the high frequency antenna 11 with the metal window 3 therebetween is provided at a lower portion of the processing chamber 5 while being insulated from the main vessel 1 by an insulation member 17. The mounting table 16 is made of a conductive material, e.g., aluminum and has an anodically oxidized surface. The mounting table 16 mounts thereon a substrate to be processed G, e.g., a LCD glass substrate. The mounting table 16 is provided with an electrostatic chuck (not shown). The substrate to be processed G is attractively held on the mounting table 16 by the electrostatic chuck. A second high frequency power supply 18 is connected to the mounting table 16 via a matching unit 19 and a power feed line 20. In the present embodiment, a bias high frequency power is applied from the second high frequency power supply 18 to the mounting table 16 via the matching unit 19 and the power feed line 20 during the plasma processing. The bias high frequency power has a frequency of, e.g., about 3.2 MHz. By applying the bias high frequency power to the mounting table 16, ions in the plasma generated in the processing chamber 5 are effectively attracted to the substrate to be processed. Although it is not particularly illustrated, the mounting table 16 has therein, e.g., a heating unit such as a ceramic heater or the like, a temperature control unit such as a coolant channel or the like, and a temperature sensor to thereby control a temperature of the substrate to be processed G.

Although the mounting table is described as an optimal unit for supporting a substrate in the present embodiment, the present invention is not limited thereto. When the supply of the bias high frequency power or the temperature control mechanism is not required, a substrate may be supported by pins or rod-shaped members which project from a lower portion or a side portion or by picks of a transfer mechanism or the like.

Provided on the sidewall 5a of the processing chamber 5 is a loading/unloading port 21 for loading and unloading a substrate to be processed G into and from the processing chamber 5. The loading/unloading port 21 is opened and closed by a gate valve 22.

Provided on a bottom wall 5b of the processing chamber 5 is a gas exhaust port 23 for exhausting an interior of the processing chamber 5. A gas exhaust unit 24 including a vacuum pump or the like is connected to the gas exhaust port 23. The interior of the processing chamber 5 is exhausted by the gas exhaust unit 24, and a pressure in the processing chamber 5 is set to and maintained at a predetermined vacuum atmosphere (e.g., about 1.33 Pa) during the plasma processing.

The inductively coupled plasma processing apparatus is controlled by a control unit 25 including a computer. The control unit 25 is connected to a user interface 26 and a storage unit 27. The user interface 26 has a keyboard with which a process manager inputs commands to operate the inductively coupled plasma processing apparatus, a display for visually displaying an operation status of the inductively coupled plasma processing apparatus and the like. The storage unit 27 stores recipes such as control programs for implementing various processes executed by the inductively coupled plasma processing apparatus under the control of the control unit 25 or programs (process recipes) for operating each component of the inductively coupled plasma processing apparatus based on the processing conditions. The process recipes may be stored in a hard disk or a semiconductor memory, or may be set in the storage unit 27 while being stored in a portable storage medium such as a CD-ROM, a DVD or the like. In addition, the recipes may be transmitted properly from another device via, e.g., a dedicated line. A required recipe is retrieved from the storage unit 27 in accordance with instructions from the user interface 26 and executed by the control unit 25 in accordance with the process recipes, thereby performing plasma processing under the control of the control unit 25.

Hereinafter, a plasma generation mechanism in the inductively coupled plasma processing apparatus shown in FIG. 1 will be described.

Figure 2:
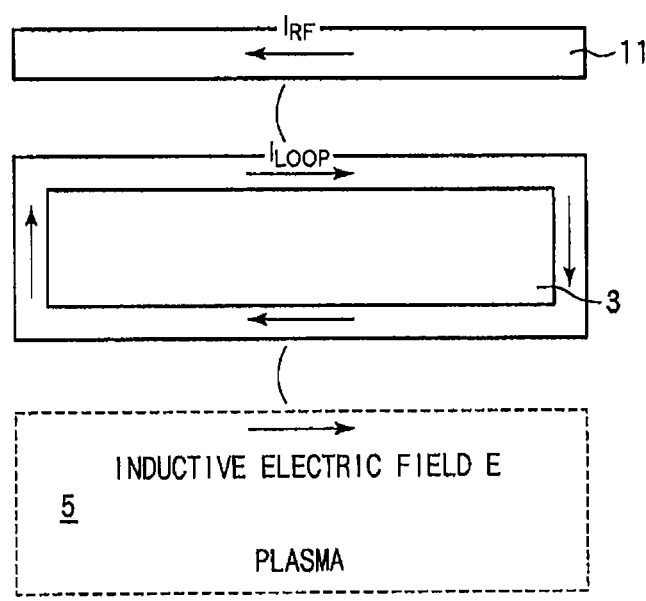
FIG. 2 is a schematic diagram for explaining a plasma generation mechanism.

FIG. 2 is a view for explaining a plasma generation mechanism.

As shown in FIG. 2, in the inductively coupled plasma processing apparatus shown in FIG. 1, an eddy current $I_{LOOP}$ is generated on the top surface of the metal window 3 (surface exposed to the high frequency antenna 11) by a current $I_{RF}$ flowing through the high frequency antenna 11. The metal window 3 is insulated from the supporting bracket 6, the supporting beam 7 and the main vessel 1. Therefore, the eddy current $I_{LOOP}$ flowing through the top surface of the metal window 3 flows through the side surface of the metal window 3 without flowing through the supporting bracket 6, the supporting beam 7 or the main vessel 1. Moreover, the eddy current $I_{LOOP}$ flowing through the side surface of the metal window 3 flows through the bottom surface of the metal window 3 (surface exposed to the processing chamber 5) and returns to the top surface of the metal window 3 through the side surface of the metal window 3. In other words, an eddy current $I_{LOOP}$ circulates in a loop from the top surface of the metal window 3 (the surface exposed to the high frequency antenna 11) to the bottom surface (the surface exposed to the processing chamber 5). An inductive electric field E is generated in the plasma generation region in the processing chamber 5 by the current flowing through the bottom surface of the metal window 3 among the eddy current $I_{LOOP}$ which circulates in a loop. Due to the inductive electric field E generated in the processing chamber 5, the gas in the processing chamber 5 is excited and converted into a plasma in the plasma generation region in the processing chamber 5.

First Embodiment

First Example of Metal Window 3

Figure 3:
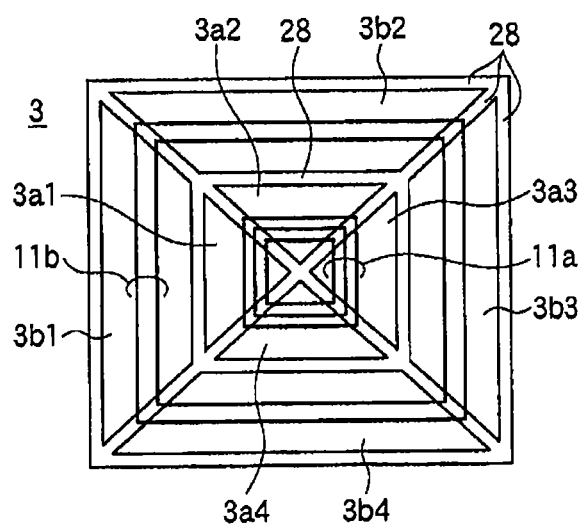
FIG. 3 is a top view showing a first example of a metal window used in the inductively coupled plasma processing apparatus in accordance with the first embodiment of the present invention.

FIG. 3 is a top view showing a first example of the metal window of the inductively coupled plasma processing apparatus in accordance with the first embodiment of the present invention.

As shown in FIG. 3, the first example of the metal window 3 has a rectangular shape when seen from above. The rectangular metal window 3 is divided into eight sections 3a1 to 3a4 and 3b1 to 3b4. The metal windows 3a1 to 3a4 and 3b1 to 3b4 are mounted on the supporting bracket 6 and the supporting beam 7 via insulators 28 and electrically insulated from each other. The insulators 28 are electrical insulators made of, e.g., ceramic or polytetrafluoroethylene (PTFE). The division of the metal window 3 and the arrangement of the high frequency antenna in this example will be described as follows.

Figure 4A:
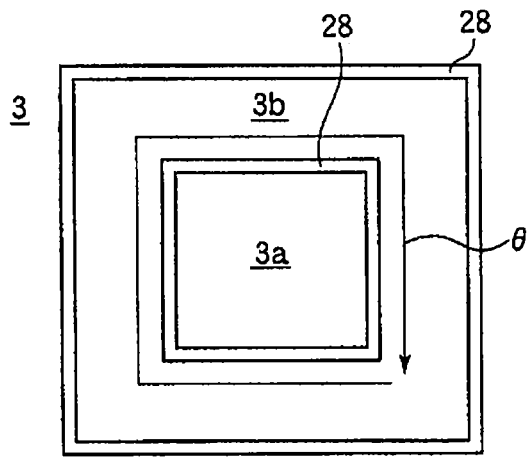
FIGS. 4A to 4C are top views for explaining division of a metal window and arrangement of a high frequency antenna.

First, as shown in FIG. 4A, the metal window 3 is divided into two sections by a line along a peripheral direction θ of the metal window 3. In the present embodiment, the metal window 3 is divided into two sections, i.e., an inner metal window 3a and an outer metal window 3b. The metal window 3 may be divided into three or more sections, if necessary.

In this specification, the "peripheral direction θ" denotes a circulation direction along the peripheral outer sides of the rectangular metal window 3.

Figure 4B:
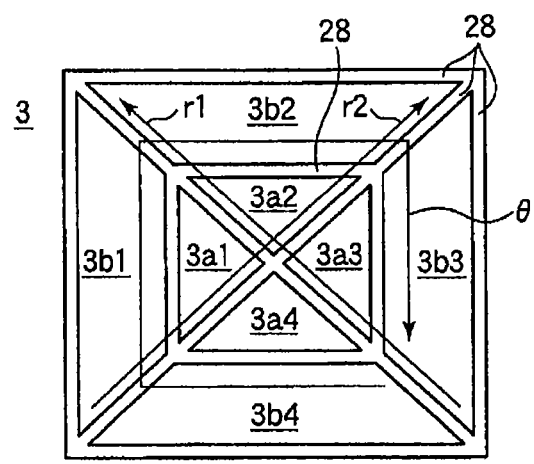

As shown in FIG. 4B, the inner metal window 3a and the outer metal window 3b divided by the line along the peripheral direction θ are further divided by a line along directions r1 and r2 crossing with the peripheral direction θ.

In this example, the directions r1 and r2 crossing with the peripheral direction θ correspond to diagonal lines of the rectangular metal window 3. Accordingly, the inner metal window 3a is divided into four sections 3a1 to 3a4, and the outer metal window 3b is divided into four sections 3b1 to 3b4.

Figure 4C:
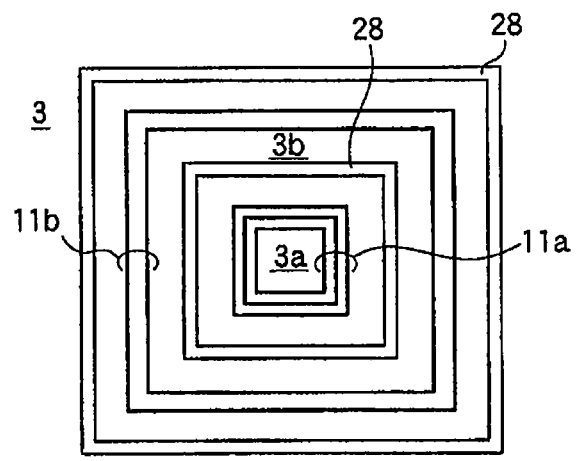

In the present embodiment, the high frequency antenna 11 includes an annular inner high frequency antenna 11a and an annular outer high frequency antenna 11b. In the present embodiment, as shown in FIG. 4C, the inner high frequency antenna 11a is disposed above the inner metal window 3a (i.e., aggregate of the inner metal windows 3a1 to 3a4), and the outer high frequency antenna 11b is disposed above the outer metal window 3b (i.e., aggregate of the outer metal windows 3b1 to 3b4).

The inductively coupled plasma processing apparatus having the metal window 3 configured as described has the following advantages.

(1) The metal window 3 is divided into two or more sections by the line along the peripheral direction θ of the metal window 3. With this configuration, the diffusion of the eddy current $I_{LOOP}$ circulating in a loop as shown in FIG. 2 can be suppressed, and the controllability of the distribution of the plasma generated in the processing chamber 5 can be further improved. Since the diffusion of the eddy current $I_{LOOP}$ circulating in a loop is suppressed, the eddy current $I_{LOOP}$ circulating in a loop can be strongly generated on the surface of the metal window 3. When the stronger eddy current $I_{LOOP}$ circulating in a loop is generated on the metal window 3, a stronger inductive electric field E can be generated in the processing chamber 5.

(2) The metal window 3 divided into two or more sections by the line along the peripheral direction θ is further divided by the line along the directions r1 and r2 crossing with the peripheral direction θ. With this configuration, the eddy current $I_{LOOP}$ circulating in a loop via the top surface, the side surface, the bottom surface, the other side surface and the top surface of the metal window 3 as shown in FIG. 2 can be generated on the surface of the metal window 3. Accordingly, the inductive electric field E can be generated in the processing chamber 5 in accordance with the mechanism described with reference to FIG. 2.

(3) When the high frequency antenna 11 is divided into the inner high frequency antenna 11a and the outer high frequency antenna 11b as in this example, the inner high frequency antenna 11a and the outer high frequency antenna 11b are disposed above the inner metal window 3a and the outer metal window 3b, respectively. With this configuration, it is possible to suppress interference between the eddy current $I_{LOOP}$ circulating in a loop which is generated in the inner metal window 3a disposed below the inner high frequency antenna 11a and the eddy current $I_{LOOP}$ circulating in a loop which is generated in the outer metal window 3b dispose below the outer high frequency antenna 11b. Hence, the intensity variation of the inductive electric field E generated in the processing chamber 5 can be suppressed, and the controllability of the plasma distribution in the processing chamber 5 can be improved.

The above-described advantages will be described in comparison with a comparative example.

Figure 5A:
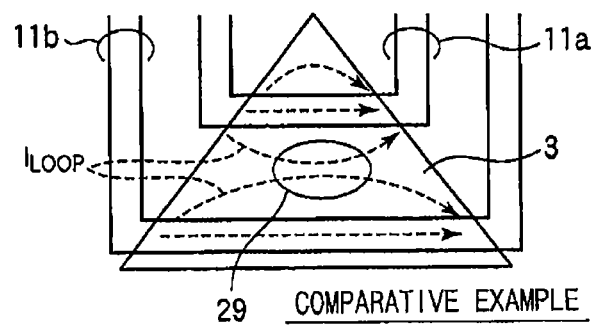
FIG. 5A shows an eddy current $I_{LOOP}$ in the case of not dividing a metal window by a line along a peripheral direction thereof.
Figure 5B:
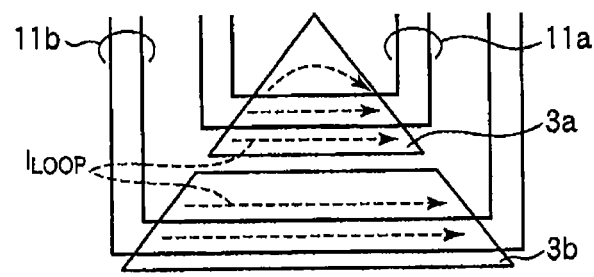
FIG. 5B shows an eddy current $I_{LOOP}$ in the case of dividing a metal window by a line along a peripheral direction thereof.

FIG. 5A shows an eddy current $I_{LOOP}$ in the case of not dividing the metal window 3 by the line along the peripheral direction θ. FIG. 5B shows an eddy current $I_{LOOP}$ in the case of dividing the metal window 3 by the line along the peripheral direction θ.

As shown in FIG. 5A, when the metal window 3 is not divided by the line along the peripheral direction θ, the eddy currents $I_{LOOP}$ are diffused and interfere with each other. Further, the intensity of the inductive electric field E generated in the processing chamber 5 becomes non-uniform.

On the other hand, when the metal window 3 is divided by the line along the peripheral direction θ as in the first embodiment, the eddy current $I_{LOOP}$ is not diffused as shown in FIG. 5B. Accordingly, the intensity deviation of the inductive electric field E generated in the processing chamber 5 is suppressed. As a result, the controllability of the plasma distribution in the processing chamber 5 is improved.

The metal window 3 of the inductively coupled plasma processing apparatus in accordance with the first embodiment can provide the following advantages.

Figure 6:
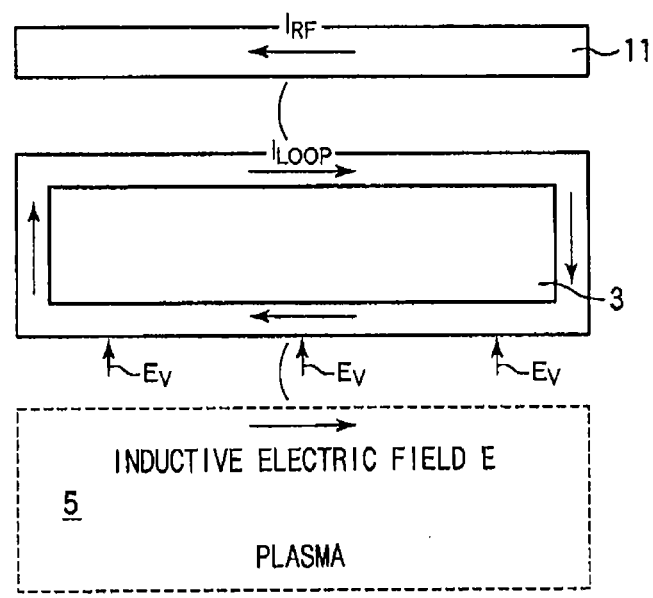
FIG. 6 is a schematic diagram for explaining a vertical electric field $E_V$ generated in a processing chamber.

A potential V of the metal window 3 is increased by an inductance L of the metal window 3 and the eddy current $I_{LOOP}$ ($V=\omega L I_{LOOP}$). If the potential of the metal window 3 is increased, a vertical electric field $E_V$ toward the metal window 3 is generated near the inner metal window 3 in the processing chamber 5 as shown in FIG. 6. When the vertical electric field $E_V$ is generated in the processing chamber 5, ions in the processing chamber 5 collide with the metal window 3, which results in consumption of the metal window 3. Due to the vertical electric field $E_V$, electrons or ions are deactivated by collision with the metal window, and the production efficiency of plasma sources is decreased.

Figure 7:
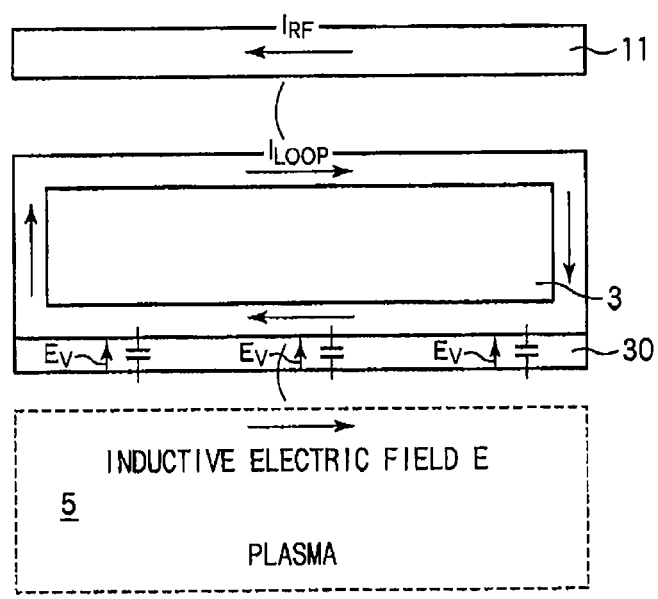
FIG. 7 is a schematic diagram for explaining a vertical electric field $E_V$ generated in a processing chamber.

The affect of the vertical electric field $E_V$ on the metal window 3 is increased when the metal window 3 has a larger size. As shown in FIG. 7, even when a dielectric film 30 is formed on the surface of the metal window 3 which faces the processing chamber 5 to improve a plasma resistance of the metal window 3, the metal window 3 is easily affected by the vertical electric field $E_V$. This is because the dielectric film 30 serving as a dielectric of a capacitor causes capacitance coupling between the metal window 3 and the processing chamber 5. An example of the dielectric field 30 includes an anodic oxide film formed by anodically oxidizing the surface of the metal window 3 made of aluminum or an alloy containing aluminum, and a thermally sprayed ceramic film.

Even in the case of providing a dielectric cover, instead of the dielectric film 30, at the surface of the metal window 3 which faces the processing chamber 5, the metal window 3 is easily affected by the vertical electric field $E_V$. An example of the dielectric cover includes a quartz cover and a ceramic cover. An example of ceramic includes an alumina ceramic.

The metal window 3 of the inductively coupled plasma processing apparatus in accordance with the first embodiment can solve the problem in which the metal window 3 is affected by the vertical electric field $E_V$.

This is because, in the first embodiment, each of the divided sections of the metal window 3 can have a further reduced size by dividing the metal window 3 by the lines along the directions crossing with the peripheral direction θ of the metal window 3 and then dividing each of the divided sections of the metal window 3 into two or more sections by the line along the peripheral direction θ of the metal window 3.

This is because the metal window 3 of the first embodiment is divided by the lines along the directions crossing with the peripheral direction θ of the metal window 3 and each of the divided sections of the metal window 3 is further divided into two or more sections by the line along the peripheral direction θ of the metal window 3. In other words, since the metal window 3 is further divided by the line along the peripheral direction θ of the metal window 3, each of the divided metal windows 3 can have a further reduced size compared to when the metal window 3 is divided by the line only along the direction crossing with the peripheral direction θ of the metal window 3.

Therefore, in accordance with the metal window 3 of the inductively coupled plasma processing apparatus of the first embodiment, it is possible to obtain the advantages in which the effect of the vertical electric field $E_V$ generated in the processing chamber 5 can be reduced and the consumption of the metal window 3 and the decrease in the production efficiency of plasma sources can be suppressed.

A longest planar size of the divided sections of the metal window 3 is preferably smaller than about ¼ of a wavelength λ of the frequency of the high frequency power supplied to the high frequency antenna 11. Accordingly, the generation of standing waves in the processing chamber 5 can be suppressed.

For example, when the high frequency power has a frequency f of about 13.56 MHz, the wavelength λ is about 22.1 m (λ=300/f[MHz]). The value of λ/4 is about 5.5 m. Therefore, when the high frequency power supplied to the high frequency antenna 11 has a frequency f of about 13.56 MHz, a longest planar size of the divided sections of the metal window 3 is preferably smaller than about 5.5 m.

Hereinafter, other examples of the metal window 3 will be described.

First Embodiment

Second Example of the Metal Window 3

Figure 8A:
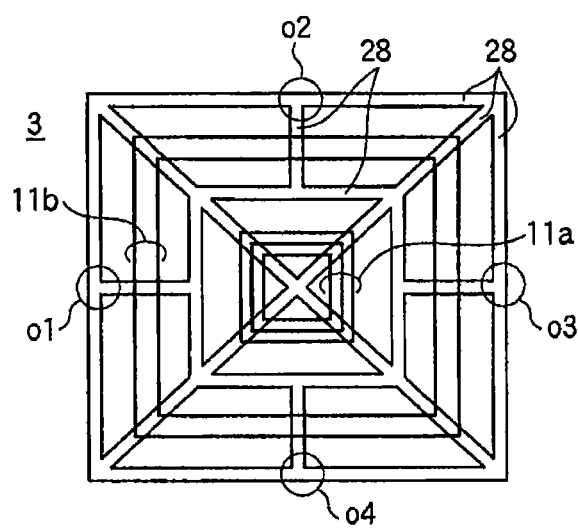
FIG. 8A is a top view showing a second example (first embodiment) of the metal window.
Figure 8B:
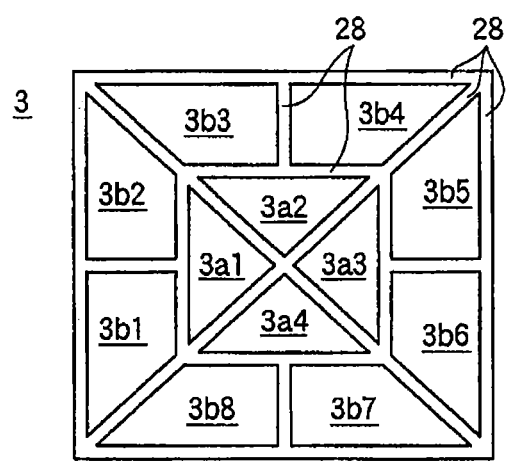
FIG. 8B is a top view in which a high frequency antenna shown in FIG. 8A is omitted.

FIG. 8A is a top view showing a second example of the metal window 3. FIG. 8B is a top view in which the high frequency antenna 11 shown in FIG. 8A is omitted.

As shown in FIGS. 8A and 8B, in the second example, the number of division of the metal window 3 by lines along the directions crossing with the peripheral direction θ of the metal window 3 is increased in a region closer to the peripheral edge of the metal window 3. In this example, the inner metal window 3a is divided into four inner metal windows 3a1 to 3a4 by the diagonal lines of the metal window 3. The outer metal window 3b is divided into four sections by the diagonal lines of the metal window 3 and each of the four sections is further divided into two subsections. For example, when the four sides of the metal window 3 are named to the first to the fourth side in the clockwise direction, the outer metal window 3b is further divided by the cross lines connecting the center o1 the first side and the center o3 of the third side opposite to the first side and connecting the center o2 of the second side and the center o4 of the fourth side opposite to the second side. In this manner, the outer metal window 3b of the second example is divided into eight outer metal windows 3b1 to 3b8.

In accordance with the second example, the number of division of the metal window 3 by the lines along the directions crossing with the peripheral direction θ of the metal window 3 is increased in a region closer to the peripheral edge of the metal window 3. Thus, especially the outer metal window 3b can be divided into much smaller sections.

First Embodiment

Third Example of the Metal Window 3

Figure 9A:
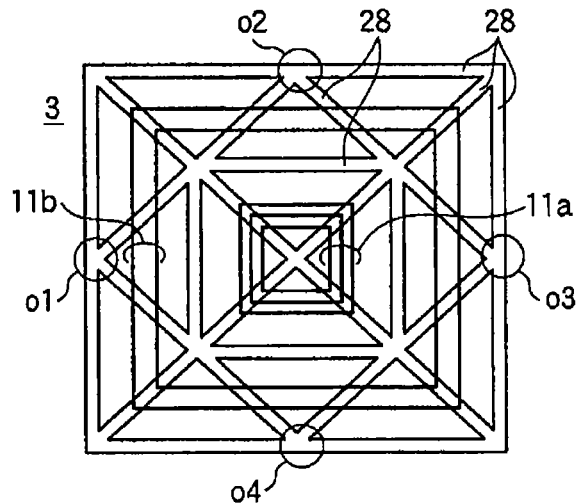
FIG. 9A is a top view showing a third example (first embodiment) of the metal window.
Figure 9B:
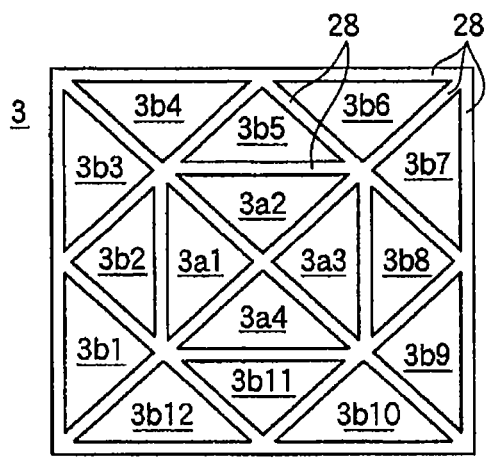
FIGS. 9B and 9C are top views in which a high frequency antenna shown in FIG. 8A is omitted.
Figure 9C:
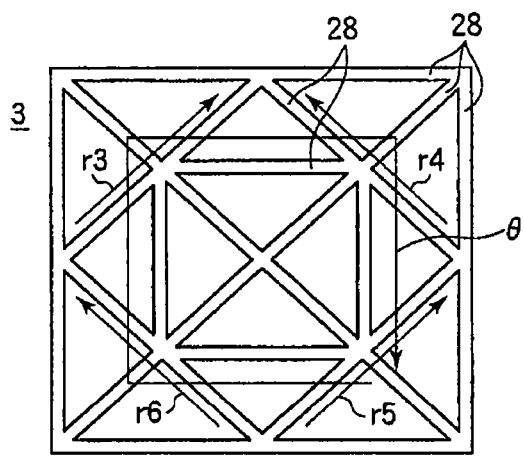

FIG. 9A is a top view showing a third example of the metal window 3. FIGS. 9B and 9C are top views in which a high frequency antenna shown in FIG. 9A is omitted.

In the metal window 3 in accordance with the first and the second example, the metal windows 3a and 3b divided into two or more sections by lines along the peripheral direction θ are divided by lines extending radially to the peripheral edge of the metal window 3 from the center of the high frequency antennas 11a and 11b rectangular ring shaped when seen from above. However, the present invention is not limited to the above.

As shown in FIGS. 9A to 9C, in the third example, the outer metal window 3b is divided further by a line connecting the center o1 of the first side and the center o2 of the second side adjacent to the first side in a clockwise direction, a line connecting the center o2 of the second side and the center o3 of the third side adjacent to the second side in the clockwise direction, a line connecting the center o3 of the third side and the center o4 of the fourth side adjacent to the third side in the clockwise direction, and a line connecting the center o4 of the fourth side and the center o1 of the first side adjacent to the fourth side in the clockwise direction. As shown in FIG. 9C, such lines correspond to directions r3 to r6 crossing with the peripheral direction θ. In other words, the outer metal window 3b of the third example is divided into twelve sections 3b1 to 3b12 by lines along the directions r3 to r6 crossing with the peripheral direction θ.

The third example can also provide the same advantages as those of the second example.

First Embodiment

Fourth Example of the Metal Window 3

Figure 10A:
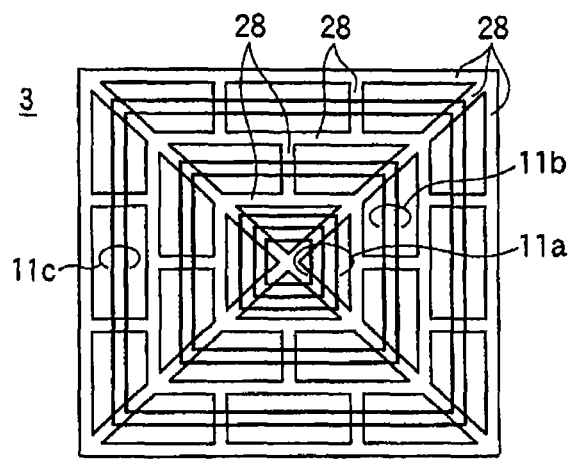
FIG. 10A is a top view showing a fourth example (first embodiment) of the metal window.
Figure 10B:
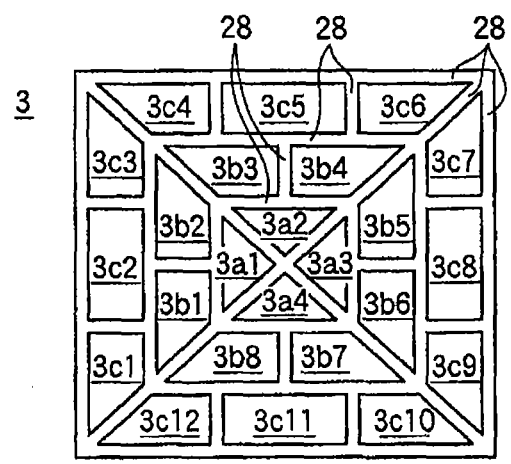
FIG. 10B is a top view in which a high frequency antenna shown in FIG. 10A is omitted.

FIG. 10A is a top view showing a fourth example of the metal window 3. FIG. 10B shows a top view in which a high frequency antenna shown in FIG. 10A is omitted.

In the first to the third example, the metal window 3 is divided into two sections by lines along the peripheral direction θ. However, the metal window 3 may be divided into three or more sections by lines along the peripheral direction θ.

As shown in FIGS. 10A and 10B, in the fourth example, the metal window 3 is divided by lines along the peripheral direction θ into three sections including an inner metal window 3a, an intermediate metal window 3b and an outer metal window 3c.

In the present embodiment, the high frequency antenna 11 includes a ring-shaped inner high frequency antenna 11a, a ring-shaped intermediate high frequency antenna 11b and a ring-shaped outer high frequency antenna 11c. In the present embodiment, as shown in FIG. 10A, the inner high frequency antenna 11a, the intermediate high frequency antenna 11b and the outer high frequency antenna 11c are positioned above the inner metal window 3a, the intermediate metal window 3b and the outer metal window 3c, respectively.

Each of the inner metal window 3a, the intermediate metal window 3b and the outer metal window 3c which are divided by lines along the peripheral direction θ is divided into four sections by the diagonal lines of the metal window 3, for example. Each of the four sections of the metal window 3b is divided into two sections as in the second example, so that the intermediate metal window 3b is divided into eight sections in total. Each of the four sections of the outer metal window 3c is divided into three sections, so that the outer metal window 3c is divided into twelve sections in total.

Accordingly, the fourth example of the metal window 3 includes the four inner metal windows 3a1 to 3a4, the eight intermediate metal windows 3b1 to 3b8, and twelve outer metal windows 3c1 to 3c12.

In the fourth example as well, the advantages obtained by the first to the third example can be obtained.

Moreover, the division number of the metal window 3 by lines along the peripheral direction θ can be further increased to four, five, six, . . . in accordance with the size of the metal window 3 and the number of the high frequency antennas 11.

Second Embodiment

The first embodiment shows the examples in which the metal window 3 is divided by the lines along the directions crossing with the peripheral direction of the metal window 3, and the metal window 3 divided by the lines along the direction crossing with the peripheral direction is further divided into two or more sections by lines along the peripheral direction.

On the other hand, in the second embodiment, the metal window 3 is divided by the lines along the directions crossing with the peripheral direction of the metal window 3, and the metal window 3 divided by the lines along the directions crossing with the peripheral direction is further partitioned into two or more sections by the slits formed in the metal window 3.

Second Embodiment

First Example of the Metal Window 3

Figure 11:
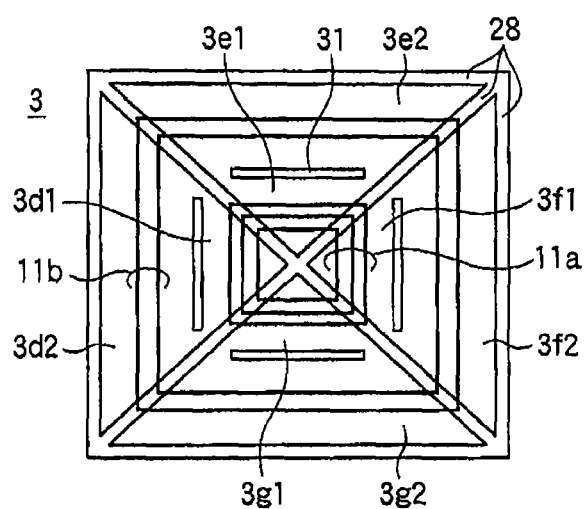
FIG. 11 is a top view showing a first example of a metal window of an inductively coupled plasma processing apparatus in accordance with a second embodiment of the present invention.
Figure 12A:
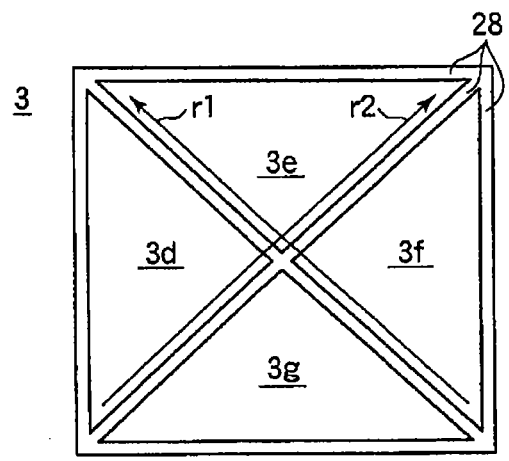
FIGS. 12A and 12B are top views for explaining division and partitioning of the metal window.
Figure 12B:
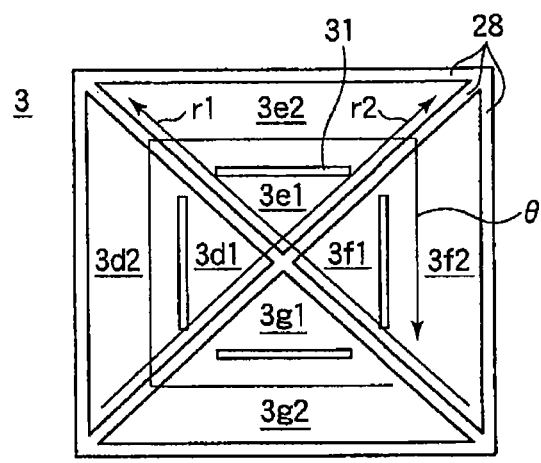

FIG. 11 is a top view showing a first example of the metal window 3 used in the inductively coupled plasma processing apparatus in accordance with a second embodiment of the present invention. FIGS. 12A and 12B are top views for explaining division and partitioning of the metal window.

As shown in FIGS. 11 to 12B, the metal window 3 in accordance with the first example has a rectangular shape when seen from above. The rectangular metal window 3 is divided by lines along the directions r1 and r2 crossing with the peripheral direction θ of the metal window 3. In this example, the directions r1 and r2 crossing with the peripheral direction θ correspond to the diagonal lines of the rectangular metal window 3. As a consequence, the metal window 3 is divided into four metal windows 3d to 3g (see particularly FIG. 12A).

Each of the metal windows 3d to 3g is partitioned into two regions by the slits 31 formed in the metal window 3. In this example, the metal windows 3d to 3g are partitioned into the inner regions 3d1 to 3g1 and the outer regions 3d2 to 3g2 by the slits 31 provided in the metal windows 3d to 3g along the peripheral direction θ to penetrate the metal windows 3d to 3g (see particularly FIG. 12B).

In this example, the high frequency antenna 11 includes the annular inner high frequency antenna 11a and the annular outer high frequency antenna 11b. In this example, the inner high frequency antenna 11a is positioned above the inner regions 3d1 to 3g1, and the outer high frequency antenna 11b is positioned above the outer regions 3d2 to 3g2 (see FIG. 11 in particular). If necessary, the number of partitioned regions may be increased to three or more by increasing the number of slits 31.

As in the first embodiment, a longest planar size of the metal windows 3d1 to 3g1 and 3d2 to 3g2 partitioned by the slits 31 is preferably set to be smaller than ¼ of the wavelength λ of the frequency of the high frequency power supplied to the high frequency antenna 11 in order to suppress the generation of standing waves in the processing chamber 5.

Figure 13:
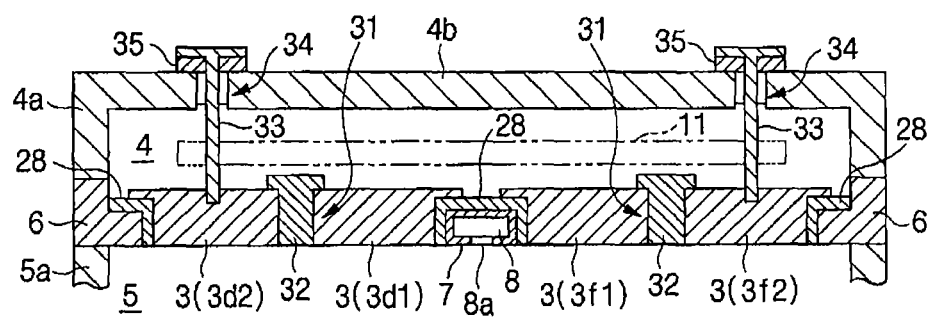
FIG. 13 is a cross sectional view showing a portion of an antenna chamber 4 of the inductively coupled plasma processing apparatus in accordance with the second embodiment of the present invention.

FIG. 13 is a cross sectional view showing the antenna chamber 4 of the inductively coupled plasma processing apparatus in accordance with the second embodiment of the present invention.

As shown in FIG. 13, insulators 32 may be provided in the slits 31 to be embedded in the slits 31, for example.

In the second embodiment, the size of each of the divided metal windows 3 tends to be increased compared to that in the first embodiment. If the size of the metal window 3 is large so that the metal window 3 may be deformed, the metal window 3 may be screw-fixed to the ceiling wall 4b of the antenna chamber 4 by screws 33, for example, while being insulated from the ceiling wall 4b, as shown in FIG. 13. In this example, through holes 34 are formed in the ceiling wall 4b so as to penetrate therethrough, and insulators 35 for blocking the through holes 34 are provided at the outer side of the upper portion of the ceiling wall 4b. Further, screws 33 smaller than a diameter of the through holes 34 are inserted into the through holes 34 via the insulators 35 without being in contact with the ceiling wall 4b, and the leading ends of the screws 33 are screw-fixed to the metal window 3. In this manner, the metal window 3 is fixed to the ceiling wall 4b while being insulated from the ceiling wall 4b.

The inductively coupled plasma processing apparatus including the metal window 3 having the slits 31 provided along the peripheral direction θ of the metal window 3 can provide the same advantages as those of the first embodiment.

In accordance with the second embodiment, each of the metal windows 3d to 3g (divided by the lines along the directions crossing with the peripheral direction θ) is partitioned into two or more sections. Therefore, the advantage of reducing the divided number of the metal window 3 can be obtained compared to that in the first embodiment. Accordingly, the second embodiment is effective in the case where a target substrate to be processed G has a smaller size compared to that in the first embodiment, for example.

Second Embodiment

Second Example of the Metal Window 3

Figure 14A:
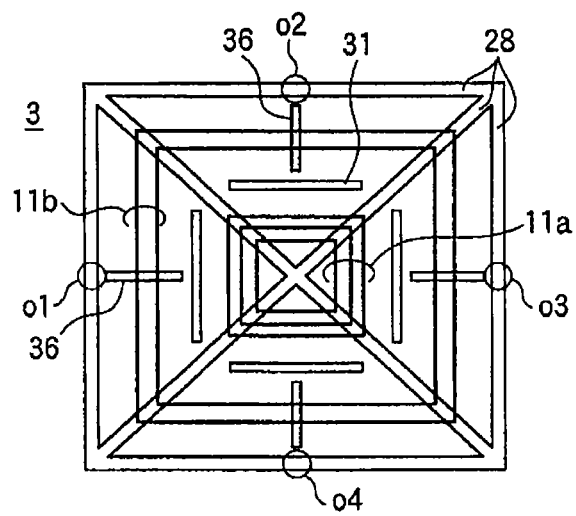
FIG. 14A is a top view showing a second example (second embodiment) of the metal window.
Figure 14B:
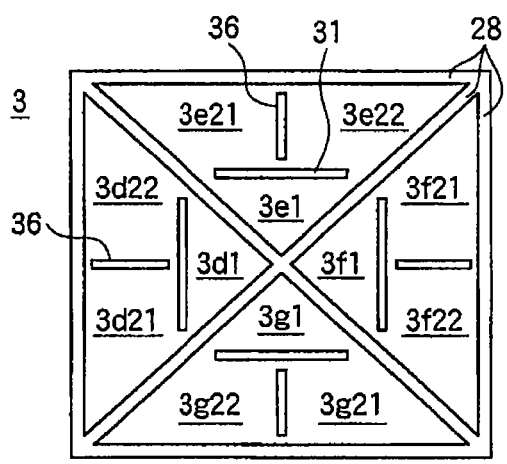
FIG. 14B is a top view in which a high frequency antenna shown in FIG. 14A is omitted.

FIG. 14A is a top view showing a second example of the metal window 3. FIG. 14B is a top view in which a high frequency antenna 11 shown in FIG. 14A is omitted.

The second example of the second embodiment corresponds to the second example of the metal window 3 of the first embodiment.

As shown in FIGS. 14A and 14B, in the second example, the two or more regions partitioned by the slit 31 are also partitioned by slits 36 provided in the metal window 3 along the direction crossing with the peripheral direction θ.

In this example, the number of sections of the metal window 3 which are partitioned by lines along the directions crossing with the peripheral direction θ is increased in a region closer to the peripheral edge of the metal window 3. In this example, the outer regions 3d2 to 3g2 are also partitioned into outer regions 3d21, 3d22, . . . , 3g21, 3g22 by the slits 36 provided in the metal window 3 along the line connecting the center o1 the first side and the center o3 of the third side opposite to the first side and the line connecting the center o2 of the second side and the center o4 of the fourth side opposite to the second side.

In other words, the inductively coupled plasma processing apparatus including the metal window 3 further having the slits 36 provided along the directions crossing with the peripheral direction θ of the metal window 3 can also provide the same advantages as those of the first embodiment.

In accordance with the second example, the number of sections of the metal window 3 which are partitioned by the lines along the directions crossing with the peripheral direction θ is increased in the region closer to the peripheral edge of the metal window 3. Therefore, especially the outer regions 3d2 to 3g2 which increase in size can be partitioned into further smaller sections.

Second Embodiment

Third Example of the Metal Window 3

Figure 15A:
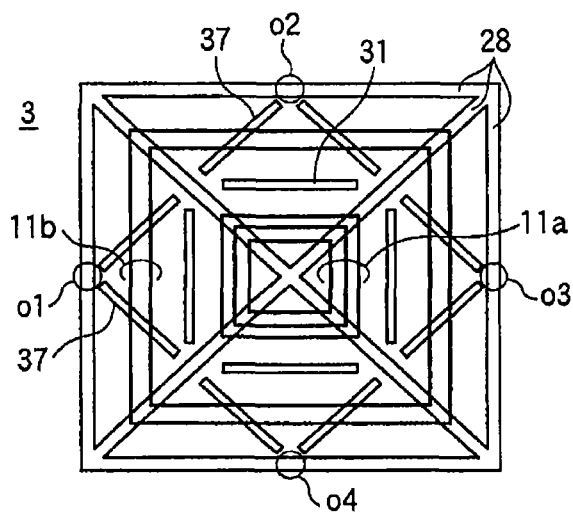
FIG. 15A is a top view showing a third example (second embodiment) of the metal window.
Figure 15B:
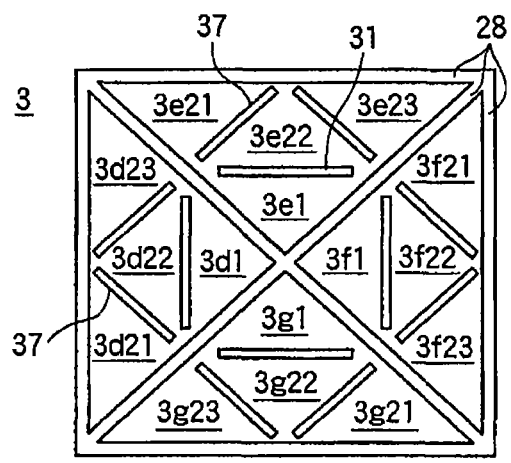
FIG. 15B is a top view in which a high frequency antenna shown in FIG. 15A is omitted.

FIG. 15A is a top view showing a third example of the metal window 3. FIG. 15B is a top view in which a high frequency antenna 11 shown in FIG. 15A is omitted.

The third example of the second embodiment corresponds to the third example of the metal window 3 of the first embodiment.

As shown in FIGS. 15A and 15B, in the third example, the outer regions 3d2 to 3g2 are further partitioned into the outer regions 3d21 to 3d23, . . . , 3g21 to 3g23 by slits 37 provided in the metal window 3 along the line connecting the center o1 the first side and the center o2 of the second side, the line connecting the center o2 of the second side and the center o3 of the third side, the line connecting the center o3 of the third side and the center o4 of the fourth side, and the line connecting the center o4 of the fourth side and the center o1 the first side.

In other words, the direction crossing with the peripheral direction θ of the metal window 3 is not limited to the direction extending radially from the center of the metal window 3.

The inductively coupled plasma processing apparatus including the metal window 3 in accordance with the third example of the second embodiment can also provide the same advantages as those of the first embodiment.

Second Embodiment

Fourth Example of the Metal Window 3

Figure 16A:
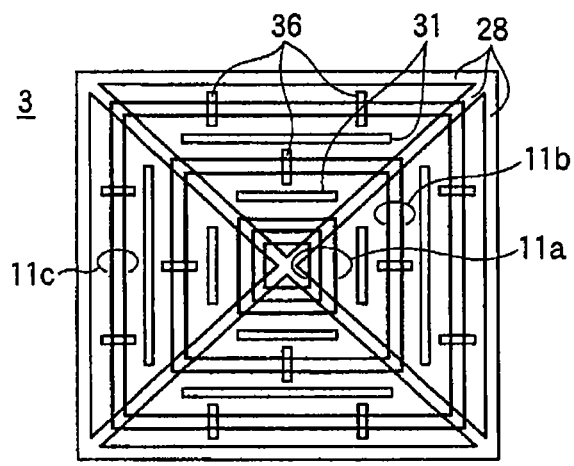
FIG. 16A is a top view showing a fourth example (second embodiment) of the metal window.
Figure 16B:
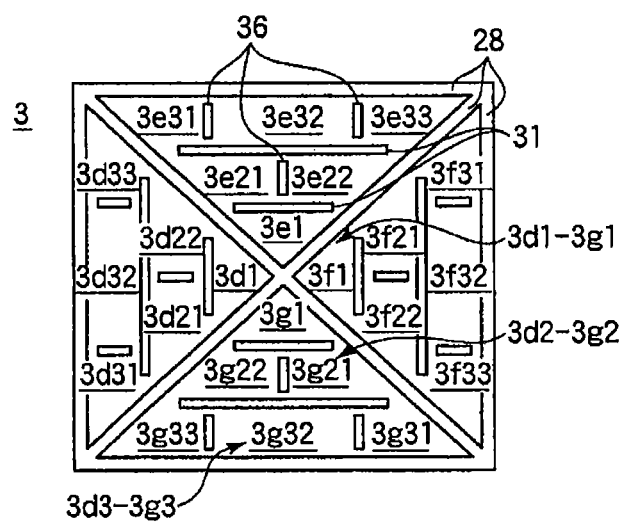
FIG. 16B is a top view in which a high frequency antenna shown in FIG. 16A is omitted.

FIG. 16A is a top view showing a fourth example of the metal window 3. FIG. 16B is a top view in which a high frequency antenna 11 shown in FIG. 16A is omitted.

The fourth example of the second embodiment corresponds to the fourth example of the metal window 3 of the first embodiment.

In the first to the third example, the metal window 3 is partitioned into two regions by the slits 31 extending along the peripheral direction θ. However, the metal window 3 may be partitioned into three or more regions by the slits 31 extending along the peripheral direction θ.

As shown in FIGS. 16A and 16B, in the fourth example, the metal window 3 is divided into three regions including the inner regions 3d1 to 3g1, the intermediate regions 3d2 to 3g2, and the outer regions 3d3 to 3g3.

The inner high frequency antenna 11a, the intermediate high frequency antenna 11b and the outer high frequency antenna 11c are positioned above the inner regions 3d1 to 3g1, the intermediate regions 3d2 to 3g2 and the outer regions 3d3 to 3g3, respectively.

The metal window 3 that is partitioned into three sections by the slits 31 and partitioned by the lines along the directions crossing with the peripheral direction θ is further partitioned into two or more regions by the slits 36 provided in the metal window 3 along the directions crossing with the peripheral direction θ.

In this example, each of the intermediate regions 3d2 to 3g2 are partitioned into two intermediate regions by the slit 36 formed in the metal window 3 along the direction crossing with the peripheral direction θ. Further, each of the outer regions 3d3 to 3g3 are partitioned into three outer regions by the slits 36 formed in the metal window 3 along the directions crossing with the peripheral direction θ.

In the fourth example as well, the same advantages as those of the first to the third example can also be obtained.

The number of sections of the metal window 3 which are partitioned by the line along the peripheral direction θ can be further increased to four, five, six, . . . in accordance with the size of the metal window 3 and the number of the high frequency antenna 11.

In accordance with the inductively coupled plasma processing apparatus of the first and the second embodiment, it is possible to deal with the scaling up of the target substrate to be processed and improve the controllability of the plasma distribution in the processing chamber.

The present invention can be variously modified without being limited to the above-described embodiments.

For example, the structure of the high frequency antenna 11 is not limited to the structure described in the above-described embodiment. For example, the spiral shaped high frequency antenna 40 shown in FIG. 17 can also be used.

Figure 17:
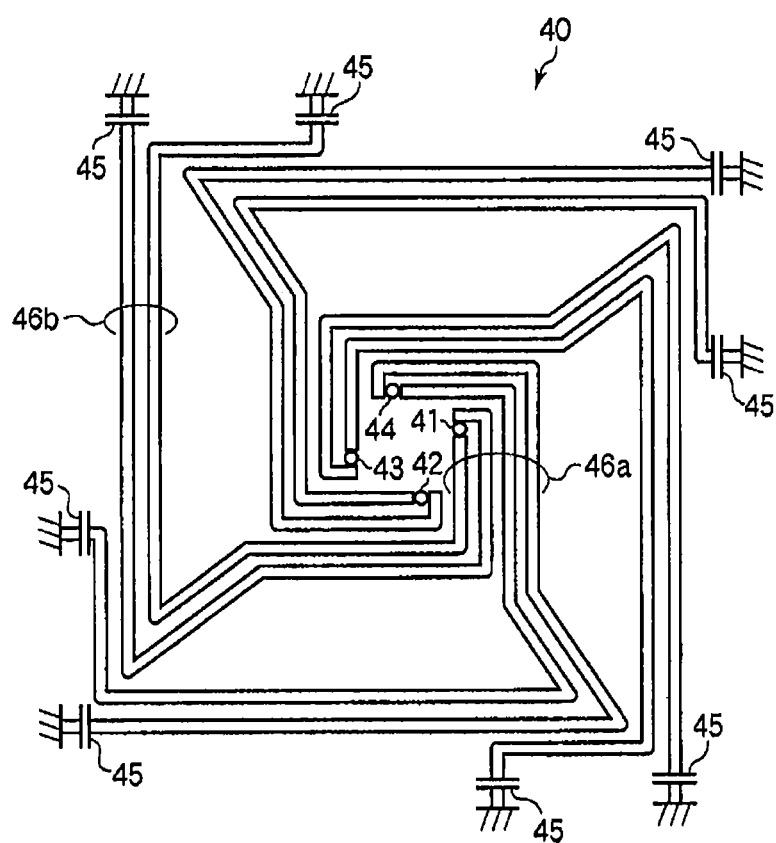
FIG. 17 is a top view showing another example of the high frequency antenna.

As shown in FIG. 17, the spiral-shaped high frequency antenna 40 includes four power feed portions 41 to 44 connected to the power feed member 15 shown in FIG. 1. The power feed portions 41 to 44 are positioned approximately on a same circle about the central portion of the spiral-shaped high frequency antenna 40 while being spaced apart from each other at an interval of about 90°. Two antenna lines extend outwardly from each of the power feed portions 41 to 44. A capacitor 45 is connected to an end portion of each antenna line, and each antenna line is grounded via the capacitor 45.

The spiral-shaped high frequency antenna 40 has portions where the antenna lines are densely disposed. In this example, the antenna lines are densely disposed at the inner and the outer portion of the spiral-shaped high frequency antenna 40. The inner portion 46a where the antenna lines are densely disposed corresponds to the inner high frequency antenna 11a of the first and the second embodiment. The outer portion 46b where the antenna lines are densely disposed corresponds to the outer high frequency antenna 11b of the first and the second embodiment.

The structure of the high frequency antenna is not limited to the ring shape or the spiral shape. As long as an inductive electric field can be generated in the main body, any structure can be employed.

In the above-described embodiment, an ashing apparatus has been described as an example of the inductively coupled plasma processing apparatus. However, the present invention can be applied to another plasma processing apparatus for performing etching, CVD film formation or the like without being limited to the ashing apparatus.

Although a FPD substrate has been described as a target substrate to be processed, the present invention can be applied to the case of processing another substrate such as a semiconductor wafer or the like without being limited thereto.

While the invention has been shown and described with respect to the embodiments, it will be understood by those skilled in the art that various changes and modification may be made without departing from the scope of the invention as defined in the following claims.

What is claimed is:

1. An inductively coupled plasma processing apparatus for performing plasma processing on a substrate by generating an inductively coupled plasma in a plasma generation region in a processing chamber, the apparatus comprising:
    a high frequency antenna configured to generate the inductively coupled plasma in the plasma generation region, the high frequency antenna being divided into at least one inner high frequency antenna having a first closed loop and an outer high frequency antenna having a second closed loop that concentrically surrounds the first closed loop of the inner high frequency antenna; and
    a metal window provided between the plasma generation region and the high frequency antenna such that the metal window is disposed directly below the high frequency antenna,
    wherein the metal window is divided into multiple sections based on a first division scheme and a second division scheme, the first division scheme divides the metal window along at least one boundary that is between the inner high frequency antenna and the outer high frequency antenna such that the metal window is divided into at least a first portion, that is overlapped by the first closed loop of the inner high frequency antenna while not being overlapped by the second closed loop of the outer high frequency antenna, and a second portion, that is overlapped by the second closed loop of the outer high frequency antenna while not being overlapped by the first closed loop of the inner high frequency antenna, the first and second portions being electrically insulated from each other and the second division scheme further divides the entire metal window into multiple portions that increase in width moving outward from a center portion of the metal window based on boundaries which cross from the center portion of the metal window to an outermost perimeter of the metal window, the multiple portions demarcated by the second division scheme being electrically insulated from each other.

2. The inductively coupled plasma processing apparatus of claim 1, wherein the second portion of the metal window that is divided by the first division scheme is further divided such that there are more divided sections of the metal window in the second portion than in the first portion.

3. The inductively coupled plasma processing apparatus of claim 1, wherein a combined size of each of the portions of the metal window divided by the second division scheme is smaller than ¼ of a wavelength of a high frequency power supplied to the high frequency antenna.

4. The inductively coupled plasma processing apparatus of claim 1, wherein, when seen from above, the metal window has a rectangular shape and the boundaries of the second division scheme are diagonal boundaries of the rectangular metal window.

5. The inductively coupled plasma processing apparatus of claim 1, wherein the metal window is non-magnetic and conductive.

6. The inductively coupled plasma processing apparatus of claim 1, wherein a dielectric film is formed on a surface of the metal window which faces the plasma generation region.

7. The inductively coupled plasma processing apparatus of claim 6, wherein the dielectric film is an anodic oxide film or a thermally sprayed ceramic film.

8. The inductively coupled plasma processing apparatus of claim 1, wherein a dielectric cover is provided on a surface of the metal window which faces the plasma generation region.

9. The inductively coupled plasma processing apparatus of claim 8, wherein the dielectric cover is made of quartz or ceramic.

10. The inductively coupled plasma processing apparatus of claim 1, wherein said first and second closed loops are concentric with the metal window.

11. The inductively coupled plasma processing apparatus of claim 1, wherein said first closed loop is out of contact with a periphery of the metal window.

* * * * *